(12) United States Patent
Lee et al.

(10) Patent No.: US 7,812,929 B2
(45) Date of Patent: Oct. 12, 2010

(54) ELECTROSTATIC CHUCK WITH TEMPERATURE SENSING UNIT, EXPOSURE EQUIPMENT HAVING THE SAME, AND METHOD OF DETECTING TEMPERATURE FROM PHOTOMASK

(75) Inventors: Myoung-Soo Lee, Suwon (KR); Chan-Uk Jeon, SeongNam (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1051 days.

(21) Appl. No.: 11/526,802

(22) Filed: Sep. 26, 2006

(65) Prior Publication Data

US 2007/0069152 A1 Mar. 29, 2007

(30) Foreign Application Priority Data

Sep. 26, 2005 (KR) ...................... 10-2005-0089365

(51) Int. Cl.
*G21K 5/10* (2006.01)
(52) U.S. Cl. .............................. 355/75; 355/30; 355/53; 355/77; 430/5; 374/120; 374/161; 356/479
(58) Field of Classification Search .................. 355/30, 355/53, 67, 72, 75; 356/450, 479, 481, 496, 356/497, 517; 374/9, 120, 121, 126, 128, 374/141, 161; 430/5

See application file for complete search history.

(56) References Cited

U.S. PATENT DOCUMENTS

| 6,642,531 | B1 * | 11/2003 | Powers ..................... 250/492.2 |
| 6,806,007 | B1 * | 10/2004 | Abdo et al. ..................... 430/5 |
| 2002/0041368 | A1 * | 4/2002 | Ota et al. ....................... 355/55 |
| 2002/0075625 | A1 * | 6/2002 | Sexton et al. ............... 361/234 |
| 2004/0012767 | A1 * | 1/2004 | Van Elp et al. ................. 355/72 |
| 2005/0259716 | A1 * | 11/2005 | Ito et al. ...................... 374/161 |
| 2006/0077394 | A1 * | 4/2006 | Suzuki et al. ............... 356/479 |

FOREIGN PATENT DOCUMENTS

| JP | 6-260387 | | 9/1994 |
| JP | 9-171246 | | 6/1997 |
| JP | 09-306834 | | 11/1997 |
| JP | 2000208390 A | * | 7/2000 |
| KR | 102000006036 A | | 10/2000 |
| KR | 1020040054081 A | | 6/2004 |

OTHER PUBLICATIONS

Korean Office Action dated Aug. 28, 2006.

* cited by examiner

*Primary Examiner*—Hung Henry Nguyen
*Assistant Examiner*—Colin Kreutzer
(74) *Attorney, Agent, or Firm*—Harness, Dickey & Pierce, P.L.C.

(57) ABSTRACT

Disclosed is an electrostatic chuck with a temperature sensing unit, exposure equipment having the electrostatic chuck, and a method of detecting temperature on photomask surfaces. The temperature sensing unit and method of detecting temperature may include obtaining reflectance of a photomask using a multi-wavelength interferometer and determining a temperature on the photomask based on the reflectance.

21 Claims, 6 Drawing Sheets

ELECTROSTATIC CHUCK WITH TEMPERATURE SENSING UNIT, EXPOSURE EQUIPMENT HAVING THE SAME, AND METHOD OF DETECTING TEMPERATURE FROM PHOTOMASK

PRIORITY STATEMENT

This U.S. non-provisional patent application claims priority under 35 U.S.C. §119 to Korean Patent Application 2005-89365 filed on Sep. 26, 2005, the entire contents of which are hereby incorporated by reference.

BACKGROUND

1. Field of Invention

Example embodiments of the present invention relate to semiconductor manufacturing equipment and methods thereof. In particular, example embodiments of the present invention relate to an electrostatic chuck (ESC) with a temperature sensing unit, exposure equipment having the ESC, and a method of detecting temperature from the surface of a photomask.

2. Description of Related Art

A photolithography process, which may be one of the processes performed during semiconductor fabrication, generally includes the operations of coating a photoresist on a wafer, exposing the photoresist of a wafer illuminated by light that is projected or reflected on a desired and/or predetermined photomask (reticle) and the wafer coated with the photoresist, and developing to form a circuit pattern by imprinting the photoresist on the wafer exposed by the light.

At least in part due to the desire for high integration semiconductor devices, increasingly small and precise photolithography processes are being used and/or required to form photoresist patterns. A permissible width of the photoresist may be determined by Rayleigh's Equation.

$$R = k1 * \lambda/NA \quad \text{(Rayleigh's Equation)}$$

In the above equation, R is resolution, k1 is a process constant, $\lambda$ is a wavelength of light source, and NA is a diameter of lens. The resolution R in Rayleigh's Equation may be decreased by decreasing the process constant k1, shortening the wavelength $\lambda$, and/or enlarging the lens diameter NA. Shortening the wavelength of light to less than the wavelength of light produced by a Krypton Flouride (KrF) laser having a 248 nm wavelength or shortening the wavelength of light to less than the wavelength of light produced by an Argon Flouride (ArF) laser having 193 nm wavelength may involve conducting an exposure process using an extreme ultraviolet (EUV) light source. The EUV light source may have a wavelength of 13.4 nm, for example.

However, a conventional exposure process using EUV are different from exposure processes using a KrF light source having a wavelength of 248 nm or ArF light source having a wavelength of 193 nm. For example, a conventional exposure process using a KrF light source or ArF light source may proceed at atmosphere and may employ a photomask that transmits light. Edges of the transparent or semi-transparent photomask may be fixed to a chuck by an absorption force in a conventional device.

However, because EUV has a very short wavelength that may be about 13.4 nm, EUV light is generally absorbed or becomes extinct while passing through most media, for example, air or quartz. In order to prevent the absorption or extinction of EUV light, an exposure process with EUV light may be conducted almost in a vacuum and may use a reflective photomask.

In conventional exposure processes using EUV light, the photomask may locally heat up because of the irradiation of light, which may result in the deformation of patterns formed on the photomask. For example, the size and shape of the patterns may vary due to thermal expansion. Further, because quartz, which is generally used as a substrate, has a small thermal conductivity, temperature is irregularly distributed over the substrate. Thus, circuit patterns may vary based on variations in temperature, which may cause difficulty in completing desired patterns.

SUMMARY

Example embodiments of the present invention are directed to an electrostatic chuck having a temperature sensing unit to detect temperature from the surface of a photomask and exposure equipment including an electrostatic chuck according to an example embodiment of the present invention.

Example embodiments of the present invention also provide a method of detecting temperature from the surface of a photomask.

According to an example embodiment of the present invention, a temperature sensing unit may be included in an electrostatic chuck of exposure equipment and may detect temperature from a surface of a photomask.

According to an example embodiment of the present invention, processing conditions, for example, stopping an exposure process may be controlled. For example, an exposure process may be stopped when the temperature of the photomask increases over a threshold and/or is outside of a permissible range. Accordingly, an exposure process may be stopped before distortion and/or deformation of circuit patterns may occur.

A temperature sensing unit may include a multi-wavelength interferometer for obtaining a refractive index and temperature according to an example embodiment of the present invention.

An example embodiment of the present invention provides an electrostatic chuck. The ESC may be included in exposure equipment and may be used to support a reflective photomask. The ESC may include a first insulation portion on which the photomask is arranged; an electrode to which a voltage is applied disposed under the first insulation portion; a second insulation portion disposed under the electrode; and one or more openings formed penetrating the first insulation portion, the electrode, and the second insulation portion. Each of the one or more openings may function as an optical path used to detect temperature from light incident on a side of the photomask.

According to an example embodiment of the present invention, an ESC may also include a temperature sensing unit disposed under the second insulation portion, which may detect temperature from the surface of the photomask.

A temperature sensing unit according to an example embodiment of the present invention may include a multi-wavelength interferometer, a first evaluator, a second evaluator and a third evaluator. The multi-wavelength interferometer may provide light incident on the backside of the photomask through the one or more openings and may measure the intensity of the light interfering with each other. The first evaluator may obtain reflectance of the photomask from the intensity. The second evaluator may obtain a refractive index of the photomask from the reflectance. The third evaluator may obtain the temperature of the surface of the photomask from the refractive index.

A reflective photomask according to an example embodiment of the present invention may include a quartz substrate, a reflection film on the quartz substrate, and a circuit pattern on the reflection film.

A multi-wavelength interferometer according to an example embodiment of the present invention may include a light source emitting multi-wavelength light; a reference mirror disposed at a side of the light source; a beam splitter dividing the multi-wavelength light into first light incident on the reference mirror, and second light incident on the quartz substrate of the photomask through the one or more openings; and a photodetector accepting first and second reflected light from the reference mirror and the reflection film of the photomask and detecting the intensity according to interference with the first and second reflected light.

According to an example embodiment of the present invention, a first evaluator may calculate the reflectance of a photomask in proportion to the square of a differential between a reference intensity value and the maximum intensity value that may be obtained by the photodetector. A second evaluator may determine a relation of refractive indexes between the reflection film and the quartz substrate using the reflectance, and a third evaluator may obtain a temperature satisfying a relation determined by the second evaluator.

According to an example embodiment of the present invention, a reflection film may include a stacked structure having at least one of the following materials: silicon (Si), molybdenum (Mo), and beryllium (Be).

According to an example embodiment of the present invention, the multi-wavelength interferometer may be a white-light interferometer.

According to an example embodiment of the present invention, the one or more openings may be shaped in one of circle, ellipse, and polygon.

An example embodiment of the present invention provides exposure equipment. The exposure equipment may include an exposure light source emitting light with a specific wavelength; a lens condensing the light on a reflective photomask; an electrostatic chuck supporting the photomask; and a fixing unit fixing a wafer to be exposed by light reflected from the photomask.

According to an example embodiment of the present invention, the light of the specific wavelength may be EUV having a wavelength less than about 13.4 nm.

An example embodiment of the present invention provides a method of detecting temperature from a photomask during an exposure process with the photomask, which has a quartz substrate and a reflection film that are stacked in sequence, in exposure equipment. The method may include irradiating multi-wavelength light from a light source to the reflection film and a reference mirror at a side of the light source; detecting light intensity according to interference with the first and second reflected light come each from the reference mirror and the reflection film; obtaining the maximum intensity value and a reference intensity value from the light intensity; calculating the reflectance of the photomask in proportion to the square of a differential between the reference intensity value and the maximum intensity value; obtaining a relation of refractive indexes between the reflection film and the quartz substrate by means of the reflectance; and obtaining the temperature until satisfying the relation.

BRIEF DESCRIPTION OF THE FIGURES

Non-limiting and non-exhaustive example embodiments of the present invention will be described with reference to the following figures, wherein like reference numerals refer to like parts throughout the various figures unless otherwise specified. In the figures.

DETAILED DESCRIPTION OF EXAMPLE EMBODIMENTS

Figure 1:
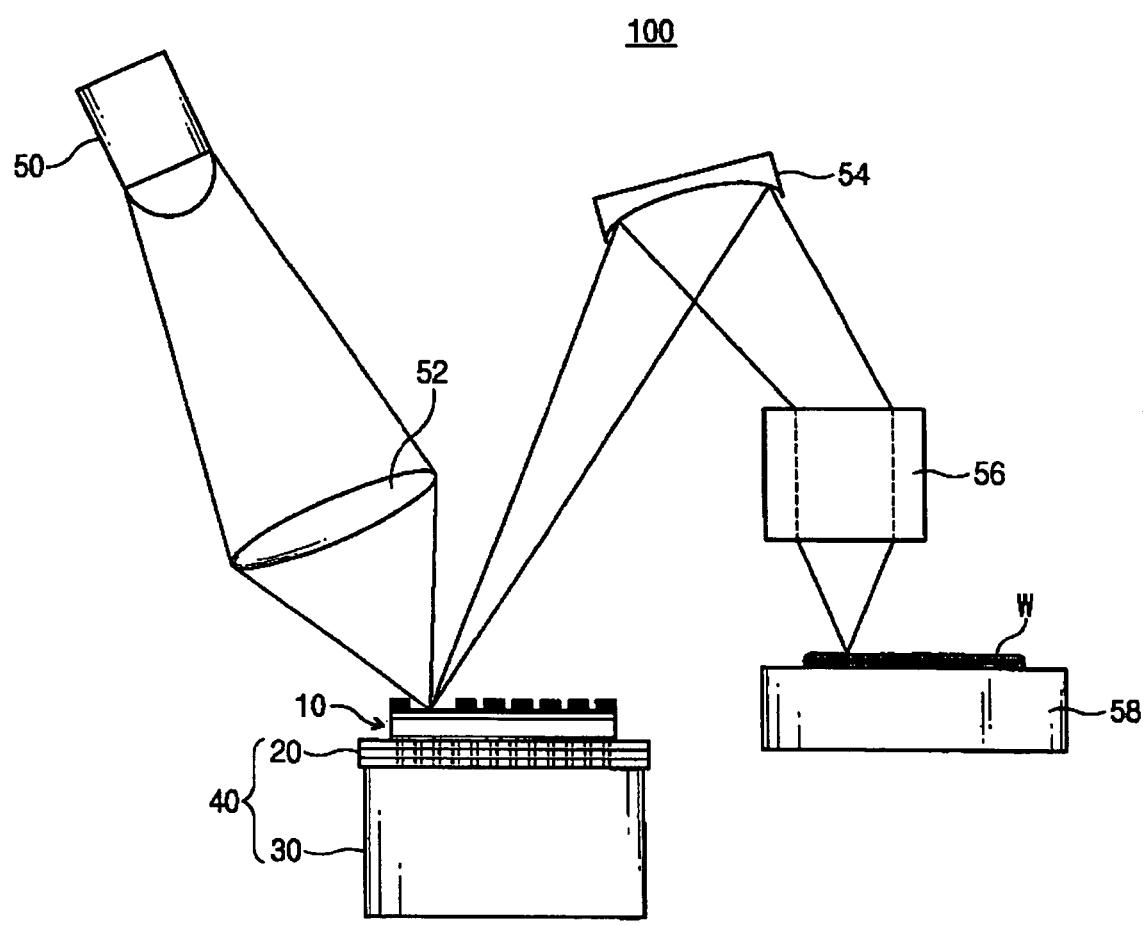
FIG. 1 schematically illustrates exposure equipment in accordance with an example embodiment of the present invention.

Various example embodiments of the present invention will be now described more fully with reference to the accompanying figures in which some example embodiments of the present invention are shown. Specific structural and functional details disclosed herein are merely representative for purposes of describing example embodiments of the present invention. This invention may, however, may be embodied in many alternate forms and should not be construed as limited to only the embodiments set forth herein.

It should be understood, that there is no intent to limit example embodiments of the present invention to the particular forms disclosed, but on the contrary, example embodiments of the present invention are to cover all modifications, equivalents, and alternatives falling within the scope of the invention. In the figures, the thicknesses of layers and regions may be exaggerated for clarity.

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the scope of example embodiments of the present invention.

Spatially relative terms, such as "beneath," "below," "lower," "above," "upper" and the like, may be used herein for ease of description to describe one element or a feature's relationship to another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments of the present invention are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments of the present invention should not be construed as limited to the particular shapes of regions illustrated herein but may include deviations in shapes that result, for example, from manufacturing.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments of the present invention belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The example embodiments described below are provided so that this disclosure will be thorough and complete, and will fully convey the scope of the invention to those skilled in the art.

Figure 2:
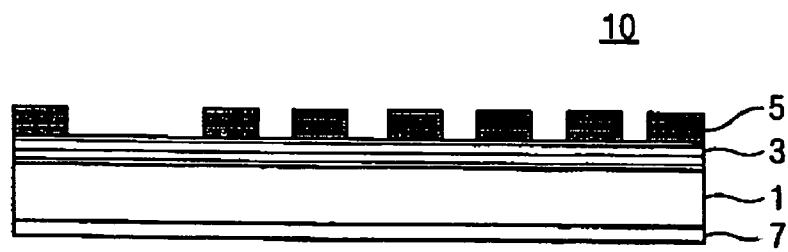
FIG. 2 illustrates a section of a photomask in accordance with an example embodiment of the present invention.
Figure 3:
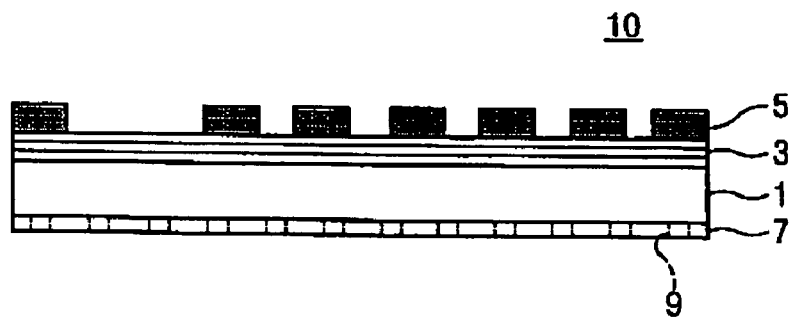
FIG. 3 illustrates a section of a photomask in accordance with an example embodiment of the present invention.
Figure 4:
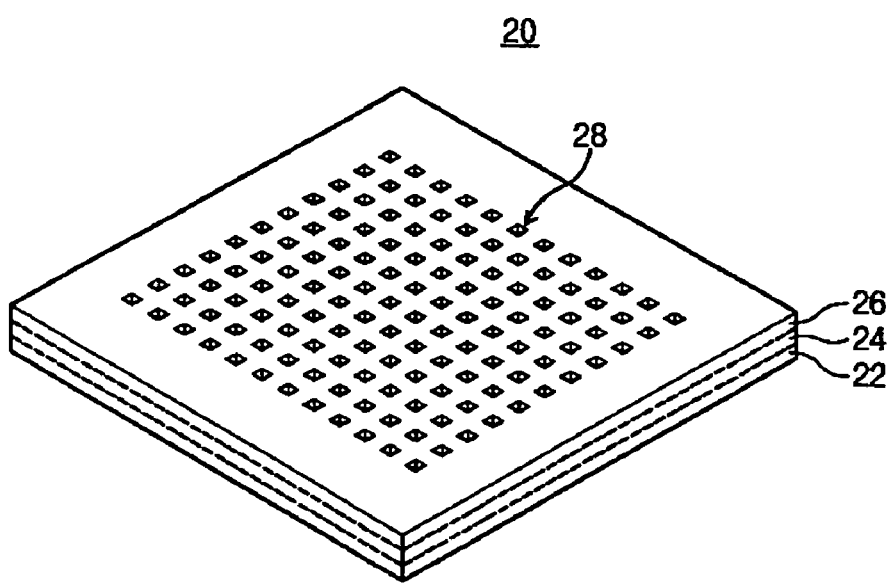
FIG. 4 is a perspective view illustrating the body of an ESC in accordance with an example embodiment of the present invention.

FIG. 1 schematically illustrates exposure equipment in accordance with an example embodiment of the present invention. FIGS. 2 and 3 illustrate sections of photomasks in accordance with example embodiments of the present invention. FIG. 4 illustrates a body of an ESC according to an example embodiment of the present invention.

Referring to FIG. 1, exposure equipment 100 may include an exposure light source 50, a first lens 52, a second lens 54, a third lens 56, a photomask 10, an ESC 40 and a fixing unit 58. The exposure light source 50 may emit EUV light having a wavelength of about 13.4 nm. The first lens 52 may condense the light emitted from the light source 50 and may irradiate the condensed light on a photomask 10. The second and third lenses 54 and 56 may condense and irradiate light reflected from the photomask 10 onto a wafer W. The photomask 10 may be a reflective type and may be supported and/or adhered to an ESC 40 via an electrostatic force. The wafer W may be supported and/or fixed to a fixing unit 58. The wafer fixing unit 58 may be a kind of ESC. The ESC 40 may include a body 20 and a temperature sensing unit 30 for detecting temperature on the surface of the photomask 10. Although not shown herein, the exposure equipment 100 may include a chamber that contains the photomask 10, the first and second lenses 52 and 54, the ESC 40, the wafer fixing unit 58, and the light source 50. A pressure of the chamber may be maintained at a pressure lower than about $10^{-3}$ Torr, almost in a vacuum.

Referring to FIGS. 2 and 3, in the photomask 10, a reflection film 3 may be disposed on a quartz substrate 1 and circuit patterns 5 absorbing light may be arranged on the reflective film 3. The reflection film 3 may be constructed of a stacked multi-layer including one or more of silicon (Si), molybdenum (Mo), and beryllium (Be). For example, the reflection film 3 may be formed of twenty stacked layers of a pair of films including a silicon film having a thickness of about 2.5 nm and a molybdenum film having a thickness of about 4.5 nm. The quartz substrate 1 may be prepared having a thickness of about 6.5 μm, for example. The circuit patterns 5 may be formed containing a metal such as nickel (Ni), germanium (Ge), tantalum (Ta), or aluminum (Al), for example. Under the quartz substrate 1, a conductive film 7 made of chrome (Cr), for example, may be provided to provide an effective connection between the substrate 1 and the ESC 40. The conductive film 7 may be formed to have a thickness of about 70 nm, for example. The conductive film 7 may include one or more openings 9, which may partially expose the quartz substrate 1.

According to an example embodiment of the present invention, a multi-wavelength interferometer 300 may be used to irradiate light to a backside of the photomask 10, monitor light reflected from the backside of the photomask 10, evaluate reflectance of the photomask 10, and obtain a temperature from the evaluated reflectance. The one or more openings 9 may act as paths for the light irradiated from the multi-wavelength interferometer 300 and thus may be used for obtaining the temperature of the photomask 10. But, if the multi-wavelength interferometer 300 is excellent in optical sensitivity, there is no problem although the openings 9 are absent in the conductive film 7.

Referring to FIG. 4, the body 20 of the ESC 40 may have one or more body openings 28. The one or more body openings 28 may be located at positions corresponding to the one or more openings 9 of the conductive film 7 in the photomask 10. The one or more body openings 28 may be formed in the shape of a circle, an ellipse, or a polygon, for example. The one or more body openings 28 may function as optical paths used during the evaluation of the reflectance of the photomask 10. The body 20 may include a first insulating portion 26, an electrode 24 and a second insulating portion 22. The first insulating portion 26 may have a containing area on which the photomask 10 may be arranged. The electrode 24 may be disposed under the first insulation portion 26 and a voltage may be applied to the electrode. The second insulation portion 22 may be disposed under the electrode portion 24. The one or more body openings 28 may be formed to penetrate the first insulating portion 26, the electrode 24, and the second insulating portion 22. The electrode 24 may be coupled to a DC generator (not shown), which may supply a voltage to the electrode 24. The supplied voltage may cause electric charges with opposite polarities to be generated at the first insulation portion 26 and the photomask 10 because of electrostatic induction. The electric charges with opposite polarities may cause an electrostatic force between the photomask 10 and the body 20 of the ESC 40, which may cause the photomask 10 to adhere to the ESC 40.

Figure 5:
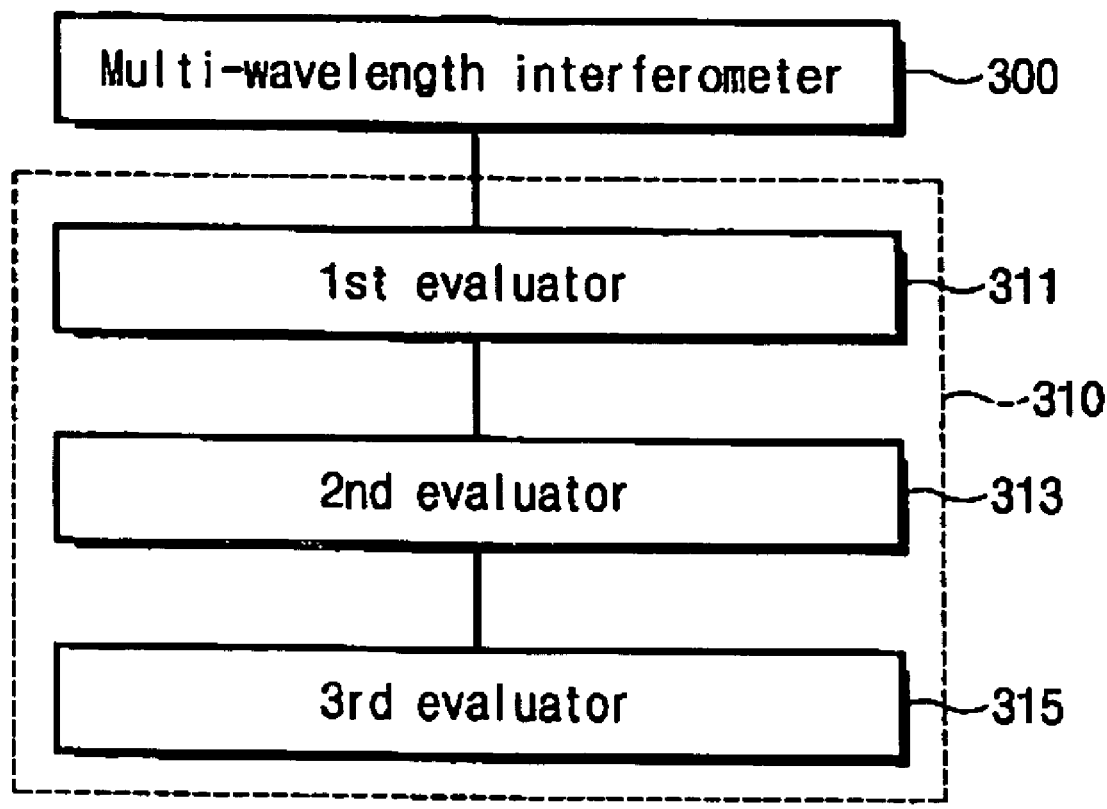
FIG. 5 is a block diagram of a temperature sensing unit employed in an ESC in accordance with an example embodiment of the present invention.
Figure 6:
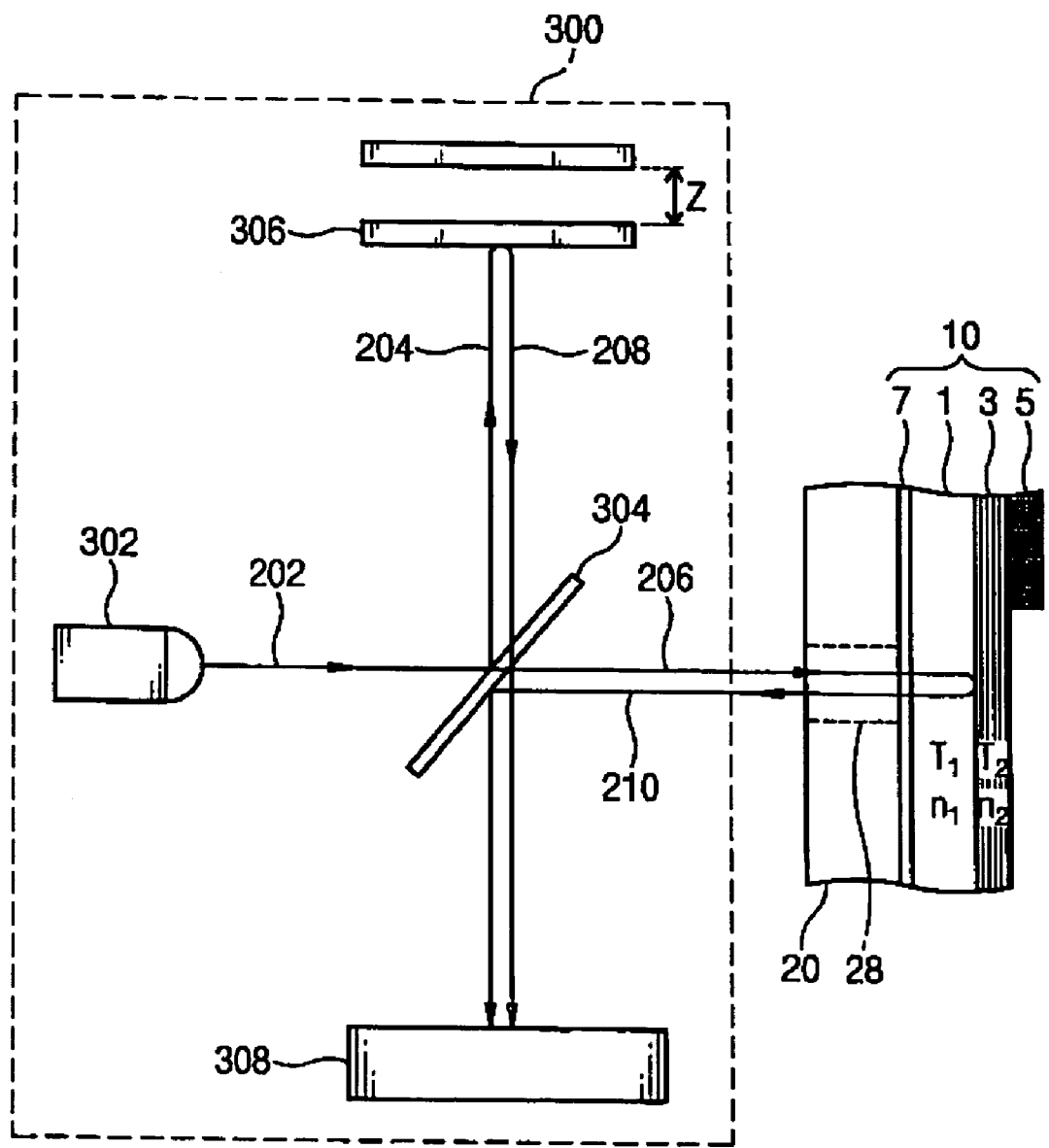
FIG. 6 shows a multi-wavelength interferometer in accordance with an example embodiment of the present invention.

FIG. 5 is a schematic illustrating a block diagram of the temperature sensing unit according to an example embodiment of the present invention, which may be included in an ESC 40 as described above. FIG. 6 shows a schematic illustrating a multi-wavelength interferometer 300 in accordance with an example embodiment of the invention, which may be used to evaluate an optical intensity.

Referring to FIGS. 5 and 6, the temperature sensing unit 30, which may be associated with the ESC 40 may include a multi-wavelength interferometer 300 and an evaluation unit 310. The evaluation unit 310 may include a first evaluator 311, a second evaluator 313 and a third evaluator 315. The multi-wavelength interferometer 300 may include a light source 302, a beam splitter 304, a reference mirror 306 and a photodetector 308. The multi-wavelength interferometer 300 may be a white-light interferometer, for example. The light source 302 may radiate multi-wavelength light 202. The reference mirror 306 may be arranged relative to the beam splitter 304 and may be movable by a desired and/or predetermined distance Z. The beam splitter 304 may divide the multi-wavelength light 202 of the light source 302 into first light 204, which may be incident on the reference mirror 306, and a second light 206, which may be incident on the quartz substrate 1 of the photomask 10 through the one or more body openings 28. The photodetector 308 may accept first reflected light 208 reflected from the reference mirror 306 and second reflected light 210 from the reflection film 3 and may detect optical intensity by observing and/or analyzing interference between the first reflected light 208 and the second reflected light 210.

Figure 7:
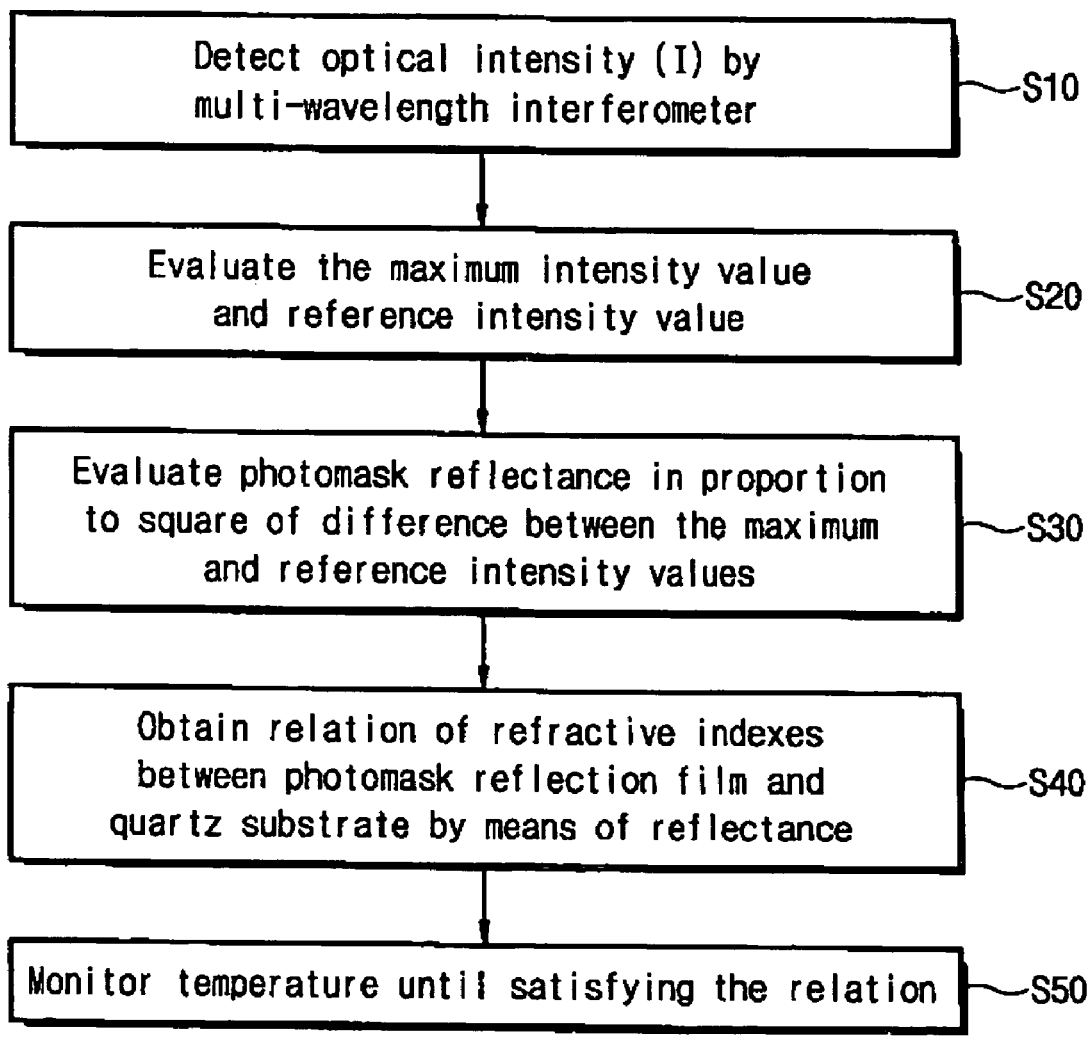
FIG. 7 is a flow chart showing a method of detecting temperature from the photomask in accordance with an example embodiment of the present invention.

Hereinafter, a method of detecting temperature using the temperature sensing unit 30, for example, with reference to FIGS. 7 and 8 will be described according to an example embodiment of the present invention. FIG. 7 is a flow chart showing a method of detecting temperature from the photomask 10 in accordance with an example embodiment of the invention, and FIG. 8 is a graphic result of an example optical intensity, which may be measured by the multi-wavelength interferometer 300 shown in FIG. 6.

Figure 8:
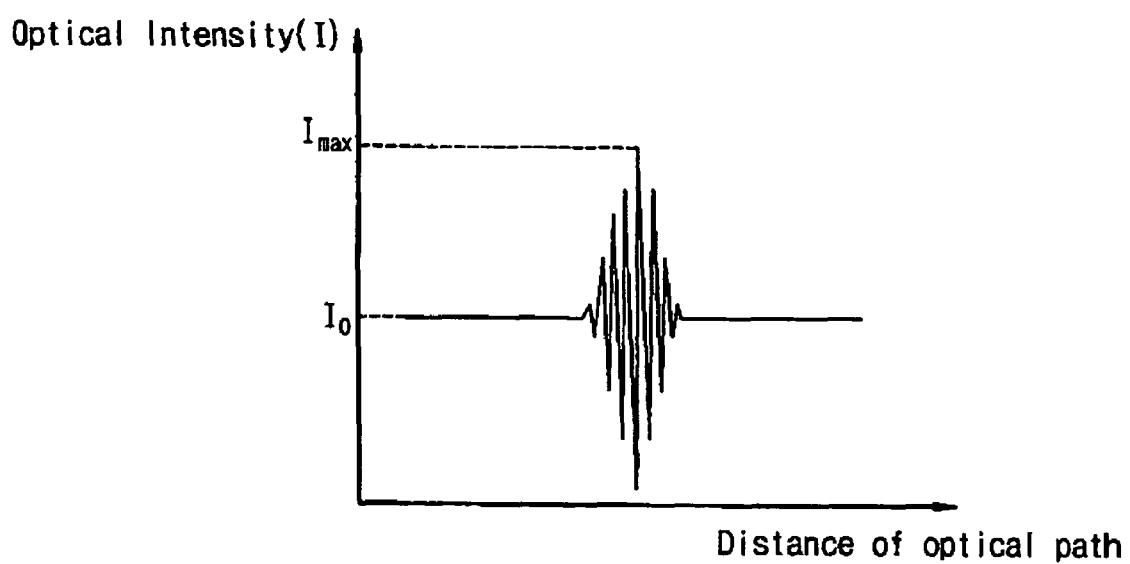
FIG. 8 is an example graphic result of an optical intensity measured by the multi-wavelength interferometer shown in FIG. 6.

Referring to FIGS. 7 and 8, while performing an exposure operation, which may be performed by the exposure equipment 100 shown in FIG. 1, an optical intensity 1 may be evaluated using the multi-wavelength interferometer 300, for example, which may be included in the temperature sensing unit 30 (S10). Example values of the optical intensity 1 detected are depicted on the graph of FIG. 8. The graph of FIG. 8, shows a reference intensity value $I_0$ and the maximum intensity value $I_{max}$ (S20).

A method of detecting temperature may include evaluating reflectance $R_{sensor}$ of the photomask 10 based on the square of a differential between the reference intensity value $I_0$ and the maximum intensity value $I_{max}$ (S30). This evaluation may be processed by the first evaluator 311. For example, the differential between the reference intensity value $I_0$ and the maximum intensity value $I_{max}$ is proportional to the reflectance $R_{sensor}$ at an interface between the quartz substrate 1 and the reflection film 3 shown in FIG. 6, may be given by Equation 1.

$$I_{max} - I_0 = C_1(R_{ref} \cdot R_{sensor})^{\frac{1}{2}} \qquad \text{(Equation 1)}$$

In Equation 1, $C_1$ is a proportional variable and $R_{ref}$ denotes inherent reflectance. From Equation 1, the reflectance $R_{sensor}$ of the photomask 10 may be obtained using Equation 2.

$$R_{sensor} = \frac{1}{R_{ref}}\left(\frac{I_{max}-I_0}{C_1}\right)^2 \qquad \text{(Equation 2)}$$

A relation between the refractive indexes between the photomask reflection film 3 and the quartz substrate 1 may be obtained by the second evaluator 313, for example, (S40) and may be output from the second evaluator 313. The reflectance $R_{sensor}$ of the photomask 10 may be summarized by Equation 3.

$$R_{sensor} = \left(\frac{n_1 - n_2}{n_1 + n_2}\right)^2 \qquad \text{(Equation 3)}$$

In Equation 3, $n_1$ represents a refractive index of the quartz substrate 1 adjacent to the interface between the quartz substrate 1 and the reflection film 3 and $n_2$ denotes a refractive index of the reflection film 3 adjacent to the interface therebetween. From Equation 3, Equation 4 may be obtained.

$$n_1 = \frac{1 + \sqrt{R_{sensor}}}{1 - \sqrt{R_{sensor}}} \cdot n_2 \qquad \text{(Equation 4)}$$

Reflectance of a material varies with temperature (T), and the refractive indexes for materials such as quartz, silicon, molybdenum, and beryllium, for example, are well known. Utilizing the refractive indexes, which may vary with temperature, a method of measuring temperature according to an example embodiment of the present invention may monitor and count temperature until Equation 4 is satisfied (S50). For example, assuming that $T_1$ is temperature of the quartz substrate 1 adjacent to the interface and $T_2$ is temperature of the reflection film 3 adjacent to the interface, the relations of $n_1=f(T_1)$ and $n_2=f(T_2)$ may be obtained. It is assumed in the example described below that the two values of temperature are identical to each other because the quartz substrate 1 is very close with the reflection film 3. And, the specific temperature T satisfying Equation 4 set relevant to the relation of refractive indexes becomes the temperature at the surface of the photomask 10 (e.g., the temperature of the reflection film 3). For example, when $n_1=3n_2$ and $T_1=T_2=25°$ C. from calculations performed using these Equations, assuming that the refractive index of quartz as the substrate 1 is 1 and the refractive index of molybdenum as the reflection film 3 is 3, the temperature at the surface of the photomask 10 is 25° C.

According to an example embodiment of the present invention, when the reflection film 3 is constructed in a stacked structure with more than two kinds of materials, it may be possible to obtain the refractive index, which may vary with temperature, through an experiment and to utilize the data of refractive index.

According to an example embodiment of the present invention, the temperature of the reflection film 3 may be assumed to be uniform because the reflection film 3 is very thin, for example, several hundreds nanometers. Accordingly, the temperature obtained by the method according to an example embodiment of the present invention described above becomes the temperature at the surface of the photomask 10, e.g., the surface of the reflection film 3.

A temperature sensing unit 30 according to an example embodiment of the present invention may repeatedly detect the temperature from the photomask 10. For example, the multi-wavelength interferometer 300 may measure the optical intensity in the interval of one minute. Then, the multi-wavelength interferometer 300 may evaluate the maximum intensity value $I_{max}$, and the reference intensity value $I_0$, and obtain values of the temperature as previously described.

According to an example embodiment of the present invention having a number of openings arranged in a N*N pattern in the body 20 of the electrostatic chuck 40, it is possible to detect temperature values from positions of the photomask 10 through the openings, which may provide a distribution profile of temperature over the surface of the photomask 10. As such, according to an example embodiment of the present invention, temperature values may be obtained from re-dividing the second light 206, which may have been separated by the beam splitter 304 of the multi-wavelength interferometer 300, into a plurality of light arranged in a N*N pattern using a splitter, and detecting values of the respective optical intensity of the N*N reflected light. A plurality of the multi-wavelength interferometers may be used to detect the N*N light reflected through the N*N openings.

As such, according to an example embodiment of the present invention, the temperature from the surface of the photomask during an exposure process with EUV may be detected. In particular, the temperature sensing unit of the lithography equipment and the method thereof, according to example embodiments of the present invention, may evaluate the reflectance of the photomask by means of a multi-wavelength interferometer to obtain the temperature of the photomask. With the result of the evaluation, processing conditions, e.g., stopping the exposure process when the temperature of the photomask increases over a permissible range, may be controlled, thereby reducing and/or preventing defects, which may occur due to distortion or deformation of circuit patterns resulting from an increase and/or decrease of temperature of the photomask.

While various example embodiments of the present invention have been described above, it will be understood by those skilled in the art that various other modifications may be made, and equivalents may be substituted, without departing from the scope of the invention. Additionally, many modifications may be made to adapt a particular situation to the teachings of the present invention without departing from the inventive concept described herein. Therefore, it is intended that the present invention not be limited to the particular example embodiments disclosed, but that the invention include all embodiments falling within the scope of the appended claims.

What is claimed is:

1. An electrostatic chuck, comprising:
    a first insulator on which a photomask is placed;
    an electrode supplied with a voltage and under the first insulator; and
    a second insulator under the electrode, wherein the first insulator, the electrode and the second insulator have at least one vacant opening, the at least one vacant opening exposing a side of the photomask and providing an optical path that detects temperature from light incident on and reflected from the side of the photomask,
    the photomask is a reflective photomask including a conductive film, a quartz substrate on the conductive film, a reflection film on the quartz substrate and a circuit pattern on the reflection film, and
    the conductive film includes at least one opening having a location corresponding to a location of the at least one vacant opening.

2. The electrostatic chuck as set forth in claim 1, further comprising:
    a temperature sensing unit disposed under the second insulator, detecting the temperature from a surface of the photomask.

3. The electrostatic chuck as set forth in claim 2, wherein the temperature sensing unit comprises:
    a multi-wavelength interferometer providing light incident on a backside of the photomask through the at least one vacant opening and measuring intensity of reflected light;
    a first evaluator calculating reflectance of the photomask from the measured intensity;
    a second evaluator determining a refractive index of the photomask from the reflectance; and
    a third evaluator obtaining the temperature of the surface of the photomask from the refractive index.

4. The electrostatic chuck as set forth in claim 1, wherein the multi-wavelength interferometer comprises:
    a light source emitting multi-wavelength light;
    a reference mirror;
    a beam splitter dividing the multi-wavelength light into first light incident on the reference mirror, and second light incident on the quartz substrate of the photomask through the at least one vacant opening; and
    a photodetector receiving first reflected light from the reference mirror and second reflected light from the reflection film of the photomask and detecting the intensity based on interference between the first reflected light and the second reflected light.

5. The electrostatic chuck as set forth in claim 4, wherein the first evaluator calculates the reflectance of the photomask in proportion to a square of a differential between a reference intensity value and a maximum intensity value obtained by the photodetector,
    wherein the second evaluator determines a relation of refractive indexes between the reflection film and the quartz substrate based on the reflectance, and
    wherein the third evaluator obtains the temperature by satisfying the relation.

6. The electrostatic chuck as set forth in claim 1, wherein the reflection film includes a stacked structure including at least one of silicon (Si), molybdenum (Mo), and beryllium (Be).

7. The electrostatic chuck as set forth in claim 3, wherein the multi-wavelength interferometer is a white-light interferometer.

8. The electrostatic chuck as set forth in claim 2, wherein the at least one vacant opening is shaped as one of a circle, an ellipse, and a polygon.

9. Exposure equipment comprising:
    an exposure light source emitting light with a wavelength;
    a lens condensing and directing the light to a photomask;

the electrostatic chuck of claim 1 supporting the photomask; and a fixing unit supporting a wafer to be exposed by light reflected from the photomask.

10. The exposure equipment as set forth in claim 9, further comprising:

a temperature sensing unit disposed under the second insulator, detecting temperature from a surface of the photomask.

11. The exposure equipment as set forth in claim 10, wherein the temperature sensing unit comprises:

a multi-wavelength interferometer providing light incident on a backside of the photomask through the at least one vacant opening of the electrostatic chuck and measuring intensity of reflected light;

a first evaluator calculating reflectance of the photomask from the measured intensity;

a second evaluator determining a refractive index of the photomask from the reflectance; and a third evaluator obtaining the temperature of the surface of the photomask from the refractive index.

12. The exposure equipment as set forth in claim 11, wherein the multi-wavelength interferometer comprises:

a light source emitting multi-wavelength light;

a reference mirror;

a beam splitter dividing the multi-wavelength light into first light incident on the reference mirror, and second light incident on the quartz substrate of the photomask through the at least one vacant opening; and a photodetector receiving first reflected light from the reference mirror and second reflected light from the reflection film of the photomask and detecting the intensity based on interference between the first reflected light and the second reflected light.

13. The exposure equipment as set forth in claim 12, wherein the first evaluator calculates the reflectance of the photomask in proportion to a square of a differential between a reference intensity value and a maximum intensity value obtained by the photodetector, wherein the second evaluator determines a relation of refractive indexes between the reflection film and the quartz substrate based on the reflectance, and wherein the third evaluator obtains the temperature by satisfying the relation.

14. The exposure equipment as set forth in claim 11, wherein the reflection film includes a stacked structure including at least one of silicon (Si), molybdenum (Mo), and beryllium (Be).

15. The exposure equipment as set forth in claim 11, wherein the multi-wavelength interferometer is a white-light interferometer.

16. The exposure equipment as set forth in claim 10, wherein the at least one vacant opening is shaped as one of a circle, an ellipse, and a polygon.

17. The exposure equipment as set forth in claim 9, wherein the light emitted from the light source is extreme ultraviolet and has a wavelength less than 13.4 nm.

18. A method of detecting temperature of a surface of a photomask, the method comprising:

providing a reflective photomask on an electrostatic chuck having at least one vacant opening exposing a side of the substrate of the photomask, the photomask including a conductive film, a quartz substrate on the conductive film, a reflection film on the quartz substrate and a circuit pattern on the reflection film, the conductive film including at least one opening having a location corresponding to a location of the at least one vacant opening;

irradiating multi-wavelength light from a light source on a reference mirror and on the reflection film and the quartz substrate of the photomask through the at least one vacant opening;

detecting light intensity based on interference between first light reflected from the reference mirror and second light reflected from the reflection film;

obtaining a maximum intensity value and a reference intensity value from the light intensity;

calculating reflectance of the photomask based on the reference intensity value and the maximum intensity value;

determining a relation of refractive indexes between the reflection film and the substrate based on the reflectance; and obtaining the temperature by satisfying the relation.

19. The method as set forth in claim 18, wherein calculating the reflectance calculates the reflectance of the photomask in proportion to a square of a differential between the reference intensity value and the maximum intensity value.

20. The method as set forth in claim 18, further comprising:

irradiating multi-wavelength light from a multi-wavelength interferometer, the multi-wavelength interferometer being a white-light interferometer.

21. The electrostatic chuck as set forth in claim 1, wherein the conductive film includes chromium (Cr).

* * * * *